(12) United States Patent
Savas et al.

(10) Patent No.: US 6,236,023 B1
(45) Date of Patent: May 22, 2001

(54) CLEANING PROCESS FOR RAPID THERMAL PROCESSING SYSTEM

(75) Inventors: Stephen E. Savas, Alameda; Martin L. Hammond, Cupertino, both of CA (US); Jean-François Daviet, Cran-Gervrier (FR)

(73) Assignee: Mattson Technology, Inc., Fremont, CA (US)

( * ) Notice: Subject to any disclaimer, the term of this patent is extended or adjusted under 35 U.S.C. 154(b) by 0 days.

(21) Appl. No.: 09/351,258

(22) Filed: Jul. 12, 1999

Related U.S. Application Data
(60) Provisional application No. 60/092,759, filed on Jul. 13, 1998.

(51) Int. Cl.[7] ........................................................ F27B 5/14
(52) U.S. Cl. .......................... 219/390; 118/70; 118/724; 134/1.1; 438/905
(58) Field of Search .................................. 219/390, 405, 219/411, 391, 393; 392/416, 418; 118/724, 725, 50.1, 70; 134/1.1, 1.2, 19, 105, 92; 438/905

(56) References Cited

U.S. PATENT DOCUMENTS

| Re. 30,505 | 2/1981 | Jacob ..................................... 156/643 |
| 5,069,724 | 12/1991 | Kobayashi et al. .................... 134/37 |
| 5,254,176 | * 10/1993 | Ibuka et al. ............................... 134/2 |
| 5,421,957 | 6/1995 | Carlson et al. ......................... 216/58 |
| 5,868,852 | 2/1999 | Johnson et al. ....................... 134/1.1 |
| 5,983,906 | * 11/1999 | Zhao et al. ............................ 134/1.1 |

* cited by examiner

Primary Examiner—Teresa Walberg
Assistant Examiner—Shawntina T. Fuqua
(74) Attorney, Agent, or Firm—Wilson Sonsini Goodrich & Rosati; Michael J. Murphy

(57) ABSTRACT

A method for in-situ cleaning of a hot wall RTP system. Internal components are heated to high temperatures above 500° C. A halocarbon gas, inert gas and oxidizing gas are flowed through the reactor for a period which may exceed 20 minutes and then purged to remove contaminants.

41 Claims, No Drawings

CLEANING PROCESS FOR RAPID THERMAL PROCESSING SYSTEM

REFERENCE TO RELATED APPLICATION

The present application claims priority from U.S. provisional application No. 60/092,759 filed Jul. 13, 1998. U.S. provisional application No. 60/092,759 is hereby incorporated herein by reference in its entirety.

BACKGROUND OF THE INVENTION

1. Field of the Invention

The invention relates to semiconductor processing, and in particular to a system and method for in-situ cleaning for rapid thermal processing systems.

2. Background

In-situ cleaning capability, cleaning the parts within a chamber and its walls while the chamber is in its operating configuration, is an important concept in semiconductor manufacturing. Frequent in-situ cleaning removes unwanted contamination and relieves the need to shut down systems and remove parts for off-system cleaning.

An early example of in-situ cleaning occurs in epitaxy reactors with SiC-coated graphite parts where the cleaning process takes place at temperatures above 1100° C. in a gas environment of $H_2$ and high concentrations of HCl gas. Another example is the in-situ cleaning of plasma deposition systems in which inert halocarbon feed gases rendered reactive in an electric discharge plasma create radicals containing fluorine and chlorine that remove silicon-based films deposited in the reactor. The reactor temperature in such systems is generally below 600° C. because the plasma supplies the necessary additional energy to create reactive species. Yet another example is the use of trichloroethane in oxygen at nominally 1000° C. to in-situ clean difflusion furnaces to remove trace metals. A highly reactive and poisonous gas, $NF_3$, has also been used at nominally 900° C. to remove deposits from reactors.

Conventional RTP systems consist of a transparent quartz envelope to provide a controlled atmosphere and an array of radiant heat lamps that shine through the quartz envelope to heat opaque objects within the envelope, such as a semiconductor substrate. The lamp power is turned on after the substrate is inserted and turned off to cool the substrate before it is removed from the quartz envelope. Because the quartz envelope is kept cool, conventional RTP systems are termed cold wall RTP systems.

Some new RTP systems, such as the Aspen RTP System sold commercially by Mattson Technology, typically incorporate one or more SiC-coated graphite heaters, a susceptor or wafer holder made of SiC-coated graphite (solid SiC or solid Si could also be used), an opaque quartz insulator surrounding the heated parts, one or more ceramic and quartz encapsulated thermocouples and a water-cooled aluminum (stainless steel is an alternate choice) vacuum enclosure with view ports, and a robotic load-lock system to control the process atmosphere. Because the substrate is inserted into an already heated enclosure, the systems are termed hot wall RTP systems. The purpose of the SiC coating on the graphite parts is to seal potential metal contamination inside the parts and prevent their migration to the semiconductor substrates.

In its current form, the Aspen RTP system is used for annealing semiconductor substrates at various temperatures from 400° C. to 1100° C. In the course of operating the Aspen RTP system, visible films are deposited on heated parts in proximity to the heater and downstream from the heated parts. Chemical analysis showed that these deposits contained Si, O, C, and N resulting from the purge gases ($N_2$,$O_2$, or a combination, possibly with other gases such as $NH_3$ or $H_2$) reacting with the heated SiC-coated graphite parts to form volatile compounds that condense on cooler furnace parts.

Some users of the system are concerned that during the annealing of certain semiconductor substrates, out-gassing from the various layers on the substrate could condense in the system and cause problems such as cross-contamination or the creation of particles. Additionally, the build-up of trace metal contamination could allow these contaminants to enter the reactor on other wafers or could migrate from the interior of heated parts to their surface.

The current technology to address contamination in conventional RTP systems is to physically remove the parts and chemically clean them. This is time consuming and results in down-time for the system. An in-situ cleaning process can reduce the down-time of the system, however, in-situ cleaning may damage components of the system such as the SiC-coated graphite or solid SiC parts, the quartz insulators, the ceramic-encapsulated thermocouples, or the metal enclosure.

An in-situ cleaning process should remove unwanted deposits that accumulate either because of out-gassing from semiconductor substrates or because of interaction of the purge gases with the heated parts, remove unwanted metal contamination regardless of its source, be effective at temperatures below 1000IC, not require the use of gases which are reactive in air and/or toxic, and use a cleaning gas that would be acceptable with regard to environmental concerns for global-warming and high altitude ozone-depletion. Additionally, an in-situ cleaning process should not leave residual gas that would affect the properties of substrates processed after the in-situ clean.

SUMMARY OF THE INVENTION

One embodiment of the invention is a system and method for in-situ cleaning of a hot wall RTP system (or other semiconductor processing equipment), comprising heating internal components of the system at an internal pressure of less than about one atmosphere, flowing a halocarbon gas into the system for more than about 1 minute, and substantially purging the halocarbon gas from the system. In other aspects of the invention internal components are heated to a temperature above about 500° C., above about 700° C., above about 900° C., between about 500° C. and about 1000° C., between about 600° C. and about 1000° C., or between about 700° C. and about 900° C.

One aspect of this embodiment comprises flowing an inert gas and an oxidizing gas into the system with the halocarbon gas. Suitable inert gases include but are not limited to helium, neon, argon, krypton, xenon, and suitable oxidizing gases include but are not limited to $O_2$ and $O_3$. Suitable halocarbon gases include but are not limited to $CHCLF_2$. In another embodiment, the halocarbon gas includes a hydrogenated halocarbon gas. Another aspect of this embodiment includes flowing the gas into the system for more than about 10 minutes, and yet another embodiment includes flowing the gas into the system for more than about 20 minutes.

DESCRIPTION

Experimentally, it was found that simply baking a system at elevated temperatures and pressures below atmospheric pressure while purging with $N_2$ does not sufficiently remove metal contamination. While it was found that new parts, properly installed, gave surface metal contamination levels in the $2-8\times10^{10}/cm^2$ when evaluated using silicon substrates with a thin thermal oxide and analyzed by VPD/AAS (vapor phase deposition, atomic absorption spectroscopy), such metal contamination levels are above the upper limit of the acceptable range for current processing of integrated circuits. However, after operating well above the design temperature range, processing non-clean wafers or introducing metallic instruments into the chamber higher levels of transition metals were observed and in the first case dielectric deposits.

Exemplary thermal processing chambers which can be used in accordance with the present invention are described in U.S. patent application Ser. Nos. 08/499,986 filed Jul. 10, 1995, for System and Method for Thermal Processing of a Semiconductor Substrate; 08/876,788 filed Jun. 16, 1997, for System and Method for Thermal Processing of a Semiconductor Substrate; and 08/923,661 filed Sep. 4, 1997, for System and Method for Rapid Thermal Processing, each of which is hereby incorporated herein by reference in its entirety.

Experimental Results

To evaluate the cleaning process, a system that had been contaminated with unwanted deposits and metals was subjected to a clean. The cleaning process used was 975° C. with 2% $CHCLF_2$, 40% $O_2$, and 58% $N_2$ for 30 minutes with pressure of 2 torr. The results were as follows:

i. All deposited material was removed from the system.

ii. No damage was evident to the heated parts.

iii. A small amount of unidentified material was deposited on the water-cooled reactor walls.

The contamination levels were as outlined in the following:

Aspen RTP Contamination Levels
(Control and with "dirty" system metal TCs present)
(VPD/AAS)

| Element | Detect limit | Control (no processing) | | "Dirty" System* | |
|---|---|---|---|---|---|
| | | Wafer Front $\times 10^{10}/cm^2$ | Wafer Back $\times 10^{10}/cm^2$ | Wafer Front $\times 10^{10}/cm^2$ | Wafer Back $\times 10^{10}/cm^2$ |
| Na | 1 | 67 | 2 | 60 | 80 |
| Al | 1 | 58 | 13 | 253 | 185 |
| Ca | 1 | 33 | 22 | 27 | 58 |
| K | 0.5 | 19 | 9.3 | 11 | 27 |
| Cr | 0.5 | <0.5 | 0.8 | 12 | 3.4 |
| Fe | 1 | 11 | 3.5 | 58 | 37 |
| Ni | 0.5 | <1 | 1.4 | 14 | 13 |
| Cu | 0.5 | 31 | 1.7 | 32 | 15 |
| Zn | 0.2 | 11 | 4.0 | 1.4 | 1.0 |

Note that the contamination levels on the frontside of the control wafer are unusually high. This may mean that spot contamination was present or that the wafer sides are incorrectly identified.

The in-situ clean process was tested for metal removal from a system which had been contaminated with metal thermocouples and the thermocouples then removed. The clean process was also tested for removal of Si/C/O/N dielectric compounds.

In a single clean step, all the Si/C/O/N dielectric compounds were removed and metal concentrations, as measured by VPD/AAS were reduced from mid-$10^{11}/cm^2$ levels to mid-$10^{10}/cm^2$ levels. In one experiment, the following levels were observed:

Aspen RTP Contamination Levels Before and After In-situ Clean
(VPD/AAS)

| Element | Detect limit | Wafer Front (not same wafer) | | Wafer Back (not same wafer) | |
|---|---|---|---|---|---|
| | | Before Clean* $\times 10^{10}/cm^2$ | After Clean $\times 10^{6}/cm^2$ | Before Clean* $\times 10^{10}/cm^2$ | After Clean $\times 10^{10}/cm^2$ |
| Na | 1 | 9.8 | 2.4 | 36 | 17 |
| Al | 1 | 27 | 10 | 52 | 45 |
| Ca | 1 | 29 | 5.0 | 54 | 29 |
| K | 0.5 | 11 | <0.5 | 17 | 7.9 |
| Cr | 0.5 | <0.5 | <0.5 | 1 | <0.5 |
| Fe | 1 | 7.2 | 1.6 | 24 | 5.8 |
| Ni | 0.5 | 0.9 | <0.5 | 2.0 | 1.8 |
| Cu | 0.5 | 3.3 | 1.2 | 3.3 | 2.2 |
| Zn | 0.2 | 1.4 | <0.2 | 0.5 | 1.2 |

*Wafers processed in Mattson Aspen RTP at 975° C. after system was contaminated with metal thermocouples and a wide range of process conditions.

In a separate test, the in-situ clean process was evaluated for its etch rate of thermal oxide on a silicon wafer. Under the same process conditions as the in-situ clean noted above, it is believed that the oxide etch rate was less than about 5 Å/minute. This result indicates that there will be no measurable effect of any residual gas on substrates processed after the in-situ clean. The concentration of such residual gas would be only a small fraction of the recipe values; therefore, the effect on thermal silicon oxide and similar layers should be far less than 5 Å/minute.

The hydrogenated halocarbon, $CHCLF_2$, was selected because it is known to have a short life in the atmosphere as compared with halocarbons which are not hydrogenated. It is noted that any variety of other halocarbon compounds (compound containing halogen and carbon) can be used in alternate embodiments.

In other embodiments of the invention increasing the temperature, the flow rate of the gases, the concentration of the reactive gases relative to the inert gas will increase the degree of reactivity, and decreasing the factors will decreases the degree of reactivity. The amount of reaction to be selected for any given situation depends on the nature and quantity of the deposits and metals to be removed. In one embodiment the relative flow rate of $O_2$ to $CHCLF_2$ is 1 to 1. The relative flow rate can be 0 to 1, ½ to 1, 1 to 1, or any ratio between 1 to 1 and 20 to 1.

Another embodiment of the invention includes an in-situ cleaning process useful for removing unwanted accumulations of dielectric films and metal contamination without damaging the system parts and without leaving a residual gas that would attack semiconductor substrates processed after the clean. This embodiment comprises heating the internal parts of the process chamber, once it has been evacuated, to an appropriate temperature, and then injecting the cleaning gases into the process chamber while it is hot and continuously pumping on this chamber to exhaust the reaction products. The process window is as follows:

| Parameter | Condition |
|---|---|
| Process Gas | Nominally 60% $N_2$ with up to 40% $O_2$ and up to 4% $CHCLF_2$, with the $O_2/CHCLF_2$ ratio being 10 or more. |
| Temperature | Nominally 900° C. Process is more effective at higher temperatures, and may be effective at temperatures as low as 500° C. |

-continued

| Parameter | Condition |
| --- | --- |
| Pressure | Nominally 2 torr or less, possibly having several pressure cycles between 2 and 10 torr to clean inside unpurged volumes within the RTP system. |
| Time | Dependent on degree of contamination to be removed. A severely contaminated system was clean to industry standards in 2 hours at 975° C. at 2 torr with pressure of 2 torr nominally. Lower levels of contamination might permit using lower temperatures, lower reactive gas concentration, shorter times and lower pressures. |

While exemplary embodiments of the invention have been described and illustrated, it will be appreciated that modification can be made to these embodiments without departing from the spirit of the invention. Thus, the invention is intended to be defined in terms of the following claims.

What is claimed is:

1. A process for cleaning a semiconductor substrate thermal processing chamber which contains internal, opaque, heated parts, the process comprising:
    heating the internal, opaque parts to a temperature between about 500° C. and 1100° C.;
    maintaining a pressure in the processing chamber less than atmospheric pressure;
    flowing a clean gas mixture containing an inert gas selected from the group consisting of nitrogen, argon, and helium, an oxidizing gas, and a reactive cleaning gas through the processing chamber for a period of time;
    wherein the oxidizing gas comprises oxygen, the reactive cleaning gas comprises $CHClF_2$, and a flow ratio of the oxidizing gas to the reactive cleaning gas is less than about 1/1, and;
    purging the cleaning gas mixture from the processing chamber with an inert gas.

2. A method of cleaning a processing chamber, the method comprising the steps of:
    heating the processing chamber to a temperature above about 500° C.;
    providing a cleaning gas mixture to the processing chamber, the cleaning gas mixture comprising an inert gas, an oxidizing gas, and a halocarbon gas;
    causing a contaminant to react with the cleaning gas mixture to form a reaction product; and
    purging the reaction product from the processing chamber.

3. The method of claim 2, wherein the contaminant comprises deposits on surfaces within the processing chamber.

4. The method of claim 3, wherein the deposits comprise elements selected from the group consisting of silicon, carbon, oxygen, and nitrogen.

5. The method of claim 2, wherein the pressure of the cleaning gas mixture within the processing chamber is less than about one atmosphere.

6. The method of claim 2, wherein the pressure of the cleaning gas mixture within the processing chamber is within the range of about 2 Torr to 10 Torr.

7. The method of claim 2, wherein the pressure of the cleaning gas mixture within the processing chamber is cycled within the range of about 2 Torr to 10 Torr.

8. The method of claim 2, wherein the halocarbon gas is $CHClF_2$.

9. The method of claim 2, wherein the inert gas is selected from the group consisting of helium, neon, argon, krypton, and xenon.

10. The method of claim 2, wherein the oxidizing gas is selected from the group consisting of $O_2$ and $O_3$.

11. The method of claim 2, wherein:
    the oxidizing gas comprises $O_2$;
    the halocarbon gas comprises $CHClF_2$; and the relative flow rate of $O_2$ to $CHClF_2$ is in the range of from about 1/1 to 20/1.

12. The method of claim 2, wherein the halocarbon gas comprises a hydrogenated halocarbon gas.

13. The method of claim 2, wherein the step of heating the processing chamber to a temperature above about 500° C. further includes heating the processing chamber to a temperature in the range of from about 500° C. to 1000° C.

14. The method of claim 2, wherein the cleaning gas mixture is flowed into the processing chamber for a period of more than about 1 minute.

15. The method of claim 2, wherein:
    the cleaning gas mixture comprises about 2 percent $CHClF_2$, about 40 percent $O_2$, and about 58 percent $N_2$;
    the pressure of the cleaning gas mixture within the processing chamber is about 2 Torr;
    the processing chamber is heated to a temperature of at least about 975° C.; and
    the cleaning gas mixture is flowed into the processing chamber for a period of at least about 30 minutes.

16. The method of claim 2, wherein the contaminant has a metal concentration of at least mid- $10^{10}/cm^2$ levels, the method further comprising the step of reducing the metal contamination to less than about mid-$10^{10}/cm^2$ levels.

17. The method of claim 16, wherein the metal contaminant is selected from the group consisting of Na, Al, Ca, K, Cr, Fe, Ni, Cu, and Zn, and the metal contaminant is reduced to a concentration less than about $10^7/cm^2$.

18. The method of claim 3, wherein the step of causing the contaminant to react with the cleaning gas further comprises a reaction on a chamber wall surface.

19. The method of claim 18, wherein the reaction occurs on a chamber wall surface comprising a material selected from the group consisting of aluminum and stainless steel.

20. The method of claim 3, wherein the step of causing a contaminant to react with the cleaning gas further comprises a reaction on an insulator surface.

21. The method of claim 20, wherein the reaction occurs on an insulator surface comprising opaque quartz.

22. The method of claim 3, wherein the step of causing a contaminant to react with the cleaning gas further comprises a reaction on a wafer holder surface.

23. The method of claim 22, wherein the reaction occurs on a wafer holder surface comprising a material selected from the group consisting of SiC-coated graphite, solid SiC, and solid Si.

24. A processing system for processing a semiconductor substrate, the system comprising:
    a processing chamber with at least one chamber wall;
    a contaminant film deposited on the chamber wall;
    a heater positioned within the processing chamber;
    a gas supply system configured to provide a cleaning gas to the processing chamber, the cleaning gas comprising an inert gas, an oxidizing gas, and a halocarbon gas; and
    an exhaust system configured to exhaust reaction products formed by the reaction of the cleaning gas with the contaminant film.

25. The processing system of claim 24, wherein the chamber wall comprises a material selected from the group consisting of aluminum and stainless steel.

26. The processing system of claim 24, wherein the contaminant film comprises elements selected from the group consisting of silicon, carbon, oxygen, and nitrogen.

27. The processing system of claim 24, wherein the contaminant film comprises a metal.

28. The processing system of claim 24 further comprising an insulator positioned inside the processing chamber between the heater and the chamber wall, wherein a second contaminant film that is reactive with the cleaning gas is deposited on the insulating wall.

29. The processing system of claim 28, wherein the insulator comprises opaque quartz.

30. The processing system of claim 28, wherein the second contaminant film comprises elements selected from the group consisting of silicon, carbon, oxygen, and nitrogen.

31. The processing system of claim 28, wherein the second contaminant film comprises a metal.

32. The processing system of claim 24 further including a wafer holder positioned inside the processing chamber, wherein a third contaminant film that is reactive with the cleaning gas is deposited on the wafer holder.

33. The processing chamber of claim 32, wherein the wafer holder comprises a material selected from the group consisting of SiC-coated graphite, solid SiC, and solid Si.

34. The processing system of claim 32, wherein the third contaminant film comprises elements selected from the group consisting of silicon, carbon, oxygen, and nitrogen.

35. The processing system of claim 32, wherein the third contaminant film comprises a metal.

36. The processing system of claim 24, wherein the halocarbon gas is $CHClF_2$.

37. The processing system of claim 24, wherein the inert gas is selected from the group consisting of helium, neon, argon, krypton, and xenon.

38. The processing system of claim 24, wherein the oxidizing gas is selected from the group consisting of $O_2$ and $O_3$.

39. The processing system of claim 24, wherein the heater is configured to heat the processing chamber to at least 500° C.

40. The processing system of claim 24, wherein the gas supply and the exhaust system are configured to maintain a pressure of the cleaning gas in the processing chamber that is less than about one atmosphere.

41. The processing system of claim 24, wherein the gas supply and exhaust system are configured to maintain a pressure of the cleaning gas within the range of about 2 Torr to 10 Torr.

\* \* \* \* \*